(12) United States Patent
Fujiwara et al.

(10) Patent No.: US 8,482,363 B2
(45) Date of Patent: Jul. 9, 2013

(54) SURFACE ACOUSTIC WAVE FILTER DEVICE, DUPLEXER INCLUDING THE SAME, AND ELECTRONIC APPARATUS INCLUDING THE SAME

(75) Inventors: Joji Fujiwara, Osaka (JP); Tetsuya Tsurunari, Osaka (JP); Hiroyuki Nakamura, Osaka (JP); Rei Goto, Osaka (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 12/878,104

(22) Filed: Sep. 9, 2010

(65) Prior Publication Data

US 2011/0063046 A1  Mar. 17, 2011

(30) Foreign Application Priority Data

Sep. 11, 2009  (JP) ................................ 2009-210068

(51) Int. Cl.
*H03H 9/72* (2006.01)
*H03H 9/64* (2006.01)

(52) U.S. Cl.
USPC ............................ 333/133; 333/193; 333/195

(58) Field of Classification Search
USPC .......... 333/133, 193–196; 310/313 B, 313 C, 310/313 D
See application file for complete search history.

(56) References Cited

U.S. PATENT DOCUMENTS

| | | | | |
|---|---|---|---|---|
| 5,790,000 A | * | 8/1998 | Dai et al. | 333/193 |
| 6,930,570 B2 | * | 8/2005 | Nakamura et al. | 333/193 |
| 7,446,629 B2 | * | 11/2008 | Nakamura et al. | 333/133 |
| 7,486,159 B2 | * | 2/2009 | Fujii et al. | 333/193 |
| 7,489,210 B2 | * | 2/2009 | Otsuka | 333/133 |
| 2002/0135267 A1 | * | 9/2002 | Takamine | 310/313 R |
| 2002/0163403 A1 | * | 11/2002 | Sawada et al. | 333/195 |
| 2002/0167378 A1 | | 11/2002 | Sawada | 333/193 |
| 2003/0137365 A1 | * | 7/2003 | Takamine | 333/133 |
| 2007/0075804 A1 | * | 4/2007 | Otsuka | 333/133 |
| 2008/0169882 A1 | * | 7/2008 | Ono et al. | 333/133 |
| 2009/0153269 A1 | * | 6/2009 | Ono et al. | 333/193 |
| 2011/0006855 A1 | * | 1/2011 | Fujiwara et al. | 333/132 |

FOREIGN PATENT DOCUMENTS

| | | |
|---|---|---|
| JP | 2002-314371 | 10/2002 |
| JP | 2009-225085 | * 10/2009 |

* cited by examiner

*Primary Examiner* — Barbara Summons
(74) *Attorney, Agent, or Firm* — Wenderoth, Lind & Ponack, L.L.P.

(57) ABSTRACT

A surface acoustic wave (SAW) filter device includes an input port for receiving an unbalanced signal, a pair of input/output ports, a first SAW filter for receiving the unbalanced signal from the input port and outputting balanced signals to the pair of input/output ports, a second SAW filter for receiving the balanced signals output from the pair of input/output ports and outputting balanced signals, and a pair of output ports for outputting the balanced signals output from the second SAW filter. The first SAW filter includes a first longitudinally-coupled SAW resonator having a first unbalanced signal input port and first and second balanced signal output ports, and a second longitudinally-coupled SAW resonator having a second unbalanced signal input port and third and fourth balanced signal output port. The first and second unbalanced signal input ports are electrically connected to the input port. The first and third balanced signal output ports both are electrically connected to one of the pair of input/output ports. The second and fourth balanced signal output ports both are electrically connected to another of the pair of input/output ports. This SAW filter device can suppress spurious and has a small insertion loss.

14 Claims, 17 Drawing Sheets

US 8,482,363 B2

SURFACE ACOUSTIC WAVE FILTER DEVICE, DUPLEXER INCLUDING THE SAME, AND ELECTRONIC APPARATUS INCLUDING THE SAME

FIELD OF THE INVENTION

The present invention relates to a surface acoustic wave filter device for use in, e.g., a mobile telephone, and also relates to a duplexer and an electronic apparatus including the filter device.

BACKGROUND OF THE INVENTION

FIG. 13 is a schematic view of a conventional surface acoustic wave (SAW) filter device 501 disclosed in Japanese Patent Laid-Open Publication No. 2002-314371. The SAW filter device 501 includes an input port 2, input/output ports 3A and 3B, output ports 4A and 4B, and SAW filters 5 and 6 provided on a piezoelectric substrate 1. The SAW filter 5 is adapted to receive an unbalanced signal from the input port 2 and output balanced signals to the input/output ports 3A and 3B. The SAW filter 6 is adapted to receive balanced signals from the input/output ports 3A and 3B and output balanced signals to the output ports 4A and 4B.

The SAW filter 5 includes longitudinally-coupled surface acoustic wave (SAW) resonators 5A and 5E. The SAW resonator 5A includes an unbalanced signal input port 5B and balanced signal output ports 5C and 5D. The SAW resonator 5E includes an unbalanced signal input port 5F and balanced signal output ports 5G and 5H.

The balanced signal output ports 5C and 5D receive and output signals having the same phase, i.e. having the phase difference which is substantially zero degree, while the balanced signal output ports 5G and 5H receive and output signals having the same phase. The signals output from the balanced signal output ports 5C and 5D have phases which are different by substantially 180 degrees from the phases of the signals output from the balanced signal output ports 5G and 5H, that is, .which are reversed from opposite the phases of the signals output from the balanced signal output ports 5G and 5H, respectively.

The balanced signal output port 5C and the balanced signal output port 5D are connected to each other and electrically connected to the input/output port 3A. The balanced signal output port 5G and the balanced signal output port 5H are connected to each other and electrically connected to the input/output port 3B.

FIG. 14 illustrates propagation characteristics of the SAW filter 5 in the SAW filter device 501. In the SAW filter 5 located at the first stage, spurious S is generated in a high frequencies in of a predetermined pass band PB0, and increases an insertion loss of the SAW filter device 501.

SUMMARY OF THE INVENTION

A surface acoustic wave (SAW) filter device includes an input port for receiving an unbalanced signal, a pair of input/output ports, a first SAW filter for receiving the unbalanced signal from the input port and outputting balanced signals to the pair of input/output ports, a second SAW filter for receiving the balanced signals output from the pair of input/output ports and outputting balanced signals, and a pair of output ports for outputting the balanced signals output from the second SAW filter. The first SAW filter includes a first longitudinally-coupled SAW resonator having a first unbalanced signal input port and first and second balanced signal output ports, and a second longitudinally-coupled SAW resonator having a second unbalanced signal input port and third and fourth balanced signal output port. The first and second unbalanced signal input ports are electrically connected to the input port. The first and third balanced signal output ports both are electrically connected to one of the pair of input/output ports. The second and fourth balanced signal output ports both are electrically connected to another of the pair of input/output ports.

This SAW filter device can suppress spurious and has a small insertion loss.

DETAIL DESCRIPTION OF PREFERRED EMBODIMENTS

Exemplary Embodiment 1

Figure 1:
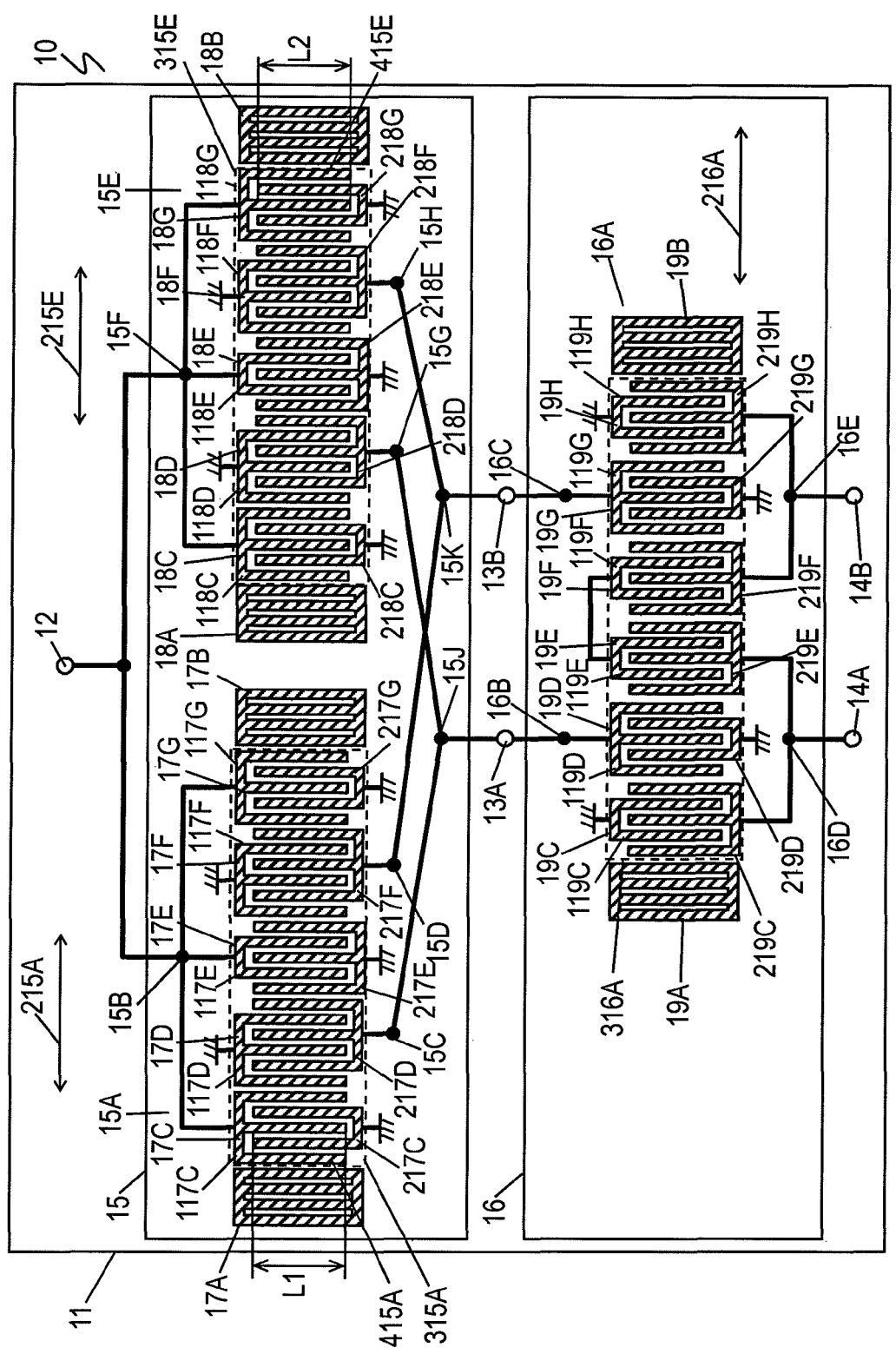
FIG. 1 is a schematic view of a surface acoustic wave (SAW) filter device according to Exemplary Embodiment 1 of the present invention.

FIG. 1 is a schematic view of a surface acoustic wave (SAW) filter device 10 according to Exemplary Embodiment 1 of the present invention. The SAW filter device 10 includes an input port 12, SAW filters 15, 16, a pair of input/output ports 13A and 13B, and a pair of output ports 14A and 14B.

The SAW filter 15 is adapted to receive an unbalanced signal from the input port 12 and output balanced signals to the paired input/output ports 13A and 13B. The SAW filter 15 includes longitudinally-coupled SAW resonators 15A and 15E. The SAW resonator 15A includes an unbalanced signal input port 15B and balanced signal output ports 15C and 15D.

The SAW resonator 15E includes an unbalanced signal input port 15F and balanced signal output ports 15G and 15H.

The unbalanced signal input port 15B and 15F are electrically connected to the input port 12. The balanced signal output ports 15C and 15G are electrically connected at a node 15J to the input/output port 13A. The balanced signal output ports 15D and 15H are electrically connected at a node 15K to the input/output port 13B.

The input and output signals which are received by and output from the input/output port 13A have phases reverse to phases of the input and output signals which are received by and output from the input/output port 13B, that is, shifted by 180 degrees from the phases of the input and output signals which are received by and output from the input/output port 13B. More particularly, in consideration of the design accuracy and the unevenness, the phase difference between signals at the input/output ports 13A and signals at the input/output port 13B is about 180°±10°.

The longitudinally-coupled SAW resonator 15A includes interdigital transducer (IDT) electrodes 17C, 17D, 17E, 17F, and 17G which are arranged in direction 215A along which surface acoustic waves propagates in surface acoustic wave propagating region 315A. Grating reflectors 17A and 17B are located at both outsides sides, in the direction 215A, of the surface acoustic wave propagating region 315A where the IDT electrodes 17C, 17D, 17E, 17F, and 17G are arranged. The IDT electrodes 17C, 17D, 17E, 17F, and 17G include comb-shaped electrodes 117C, 117D, 117E, 117F, and 117G comb-shaped electrodes 217C, 217D, 217E, 217F, and 217G facing comb-shaped electrodes 117C, 117D, 117E, 117F, and 117G, respectively.

The longitudinally-coupled SAW resonator 15E includes IDT electrodes 18C, 18D, 18E, 18F, and 18G which are arranged in a direction 215E along which surface acoustic wave propagates in the surface acoustic wave propagating region 315E. Grating reflectors 18A and 18B are located at both outsides, in the direction 215E, of the surface acoustic wave propagating region 315E where the IDT electrodes 18C, 18D, 18E, 18F, and 18G are arranged. The IDT electrodes 18C, 18D, 18E, 18F, and 18G include comb-shaped electrodes 118C, 118D, 118E, 118F, and 118G and comb-shaped electrodes 218C, 218D, 218E, 218F, and 218G facing comb-shaped electrodes 118C, 118D, 118E, 118F, and 118G.

The comb-shaped electrodes 117C, 117E, and 117G of IDT electrodes 17C, 17E, and 17G are electrically connected to the unbalanced signal input port 15B while the comb-shaped electrodes 217C, 217E, and 217G are electrically connected to a ground. The comb-shaped electrodes 118C, 118E, 118G of IDT electrodes 18C, 18E, and 18G are electrically connected to the unbalanced signal input port 15F while the comb-shaped electrodes 218C, 218E, and 218G are electrically connected to the ground.

Electrode fingers of the comb-shaped electrodes 117C, 117E, and 117G of IDT electrodes 17C, 17E, and 17G overlap interdigitally electrode fingers of the comb-shaped electrodes 217C, 217E, and 217G, respectively. Similarly, electrode fingers of the comb-shaped electrodes 118C, 118E, and 118G of IDT electrodes 18C, 18E, and 18G overlap interdigitally electrode fingers of the comb-shaped electrodes 218C, 218E, and 218G, respectively.

The comb-shaped electrode 117D of the IDT electrode 17D is grounded while the comb-shaped electrode 217D is electrically connected to the balanced signal output port 15C. The comb-shaped electrode 118D of the IDT electrode 18D is grounded while the comb-shaped electrode 218D is electrically connected to the balanced signal output port 15G. As described above, both the balanced signal output ports 15C and 15G are electrically connected at the node 15J to the input/output ports 13A.

Similarly, the comb-shaped electrode 117F of the IDT electrode 17F is grounded while the comb-shaped electrode 217F is electrically connected to the balanced signal output port 15D. The comb-shaped electrode 118F of the IDT electrode 18F is grounded while the comb-shaped electrode 218F is electrically connected to the balanced signal output port 15H. As described above, both the balanced signal output ports 15D, 15H are electrically connected at the node 15K to the input/output ports 13B.

Electrode fingers of the comb-shaped electrodes 117D, 117F, 118D, and 118F of IDT electrodes 17D, 17F, 18D, and 18F overlaps interdigitally electrode fingers of the comb-shaped electrodes 217D, 217F, 218D, and 218F, respectively.

The SAW filter 15 causes the phase of the signal output from the balanced signal output port 15C to be reversed to the phase of the signal output from the balanced signal output port 15D. In addition, the phase of the signal output from the balanced signal output port 15G and the phase of the signal output from the balanced signal output port 15H are reversed to each other. Moreover, the signal output from the balanced signal output port 15C has a phase identical to a phase of the signal output from the balanced signal output port 15G. The phase of the signal output from the balanced signal output port 15D and the phase of the signal output from the balanced signal output port 15H have phases identical to each other.

This construction, the phase of the input and output signals at the input/output signal port 13A are reversed to the phase of the input and output signals on the input/output signal port 13B.

The SAW filter 16 is adapted to receive balanced signals from the pair of input/output ports 13A and 13B and output balanced signals to the pair of output ports 14A and 14B. The SAW filter 16 includes a longitudinally-coupled SAW resonator 16A. The SAW resonator 16A includes a pair of balance signal input ports 16B and 16C and a pair of balanced signal output ports 16D and 16E. The longitudinally-coupled SAW resonator 16A includes IDT electrodes 19C, 19D, 19E, 19F, 19G, and 19H which are arranged in a direction 216 along which surface acoustic waves propagates in the surface acoustic wave propagating region 316. Grating reflectors 19A, 19B are located at both outsides, in the direction 216, of the surface acoustic wave propagating region 316 where the IDT electrodes 19C, 19D, 19E, 19F, 19G, and 19H are arranged. The IDT electrodes 19C, 19D, 19E, 19F, 19G, and 19H include comb-shaped electrodes 119C, 119D, 119E, 119F, 119G, and 119H and comb-shaped electrodes 219C, 219D, 219E, 219F, 219G, and 219H facing comb-shaped electrodes 19C, 19D, 19E, 19F, 19G, and 19H, respectively.

The pair of balanced signal input ports 16B and 16C are electrically connected to the pair of input/output ports 13A and 13B respectively. The pair of balanced signal output ports 16D and 16E are electrically connected to the pair of output ports 14A and 14B, respectively.

The SAW filter device 10 can suppress undesired spurious in high frequencies in a predetermined frequency band and reduces an insertion loss.

Figure 2:
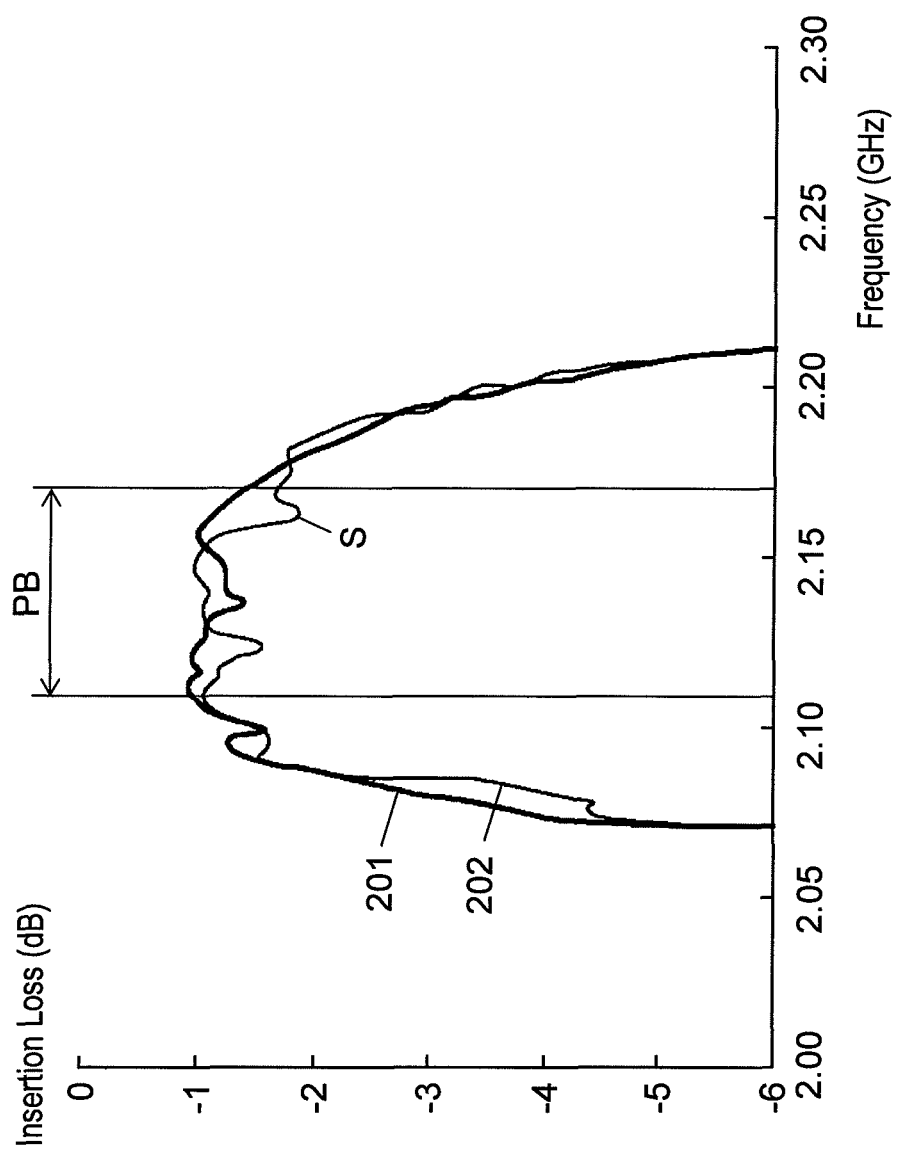
FIG. 2 illustrates propagation characteristics of a SAW filter of the SAW filter device according to Embodiment 1.

FIG. 2 illustrates propagation characteristics of the SAW filter 15. In FIG. 2, the horizontal axis represents the frequency, and the vertical axis represents the insertion loss of the filter at frequencies.

Figure 13:
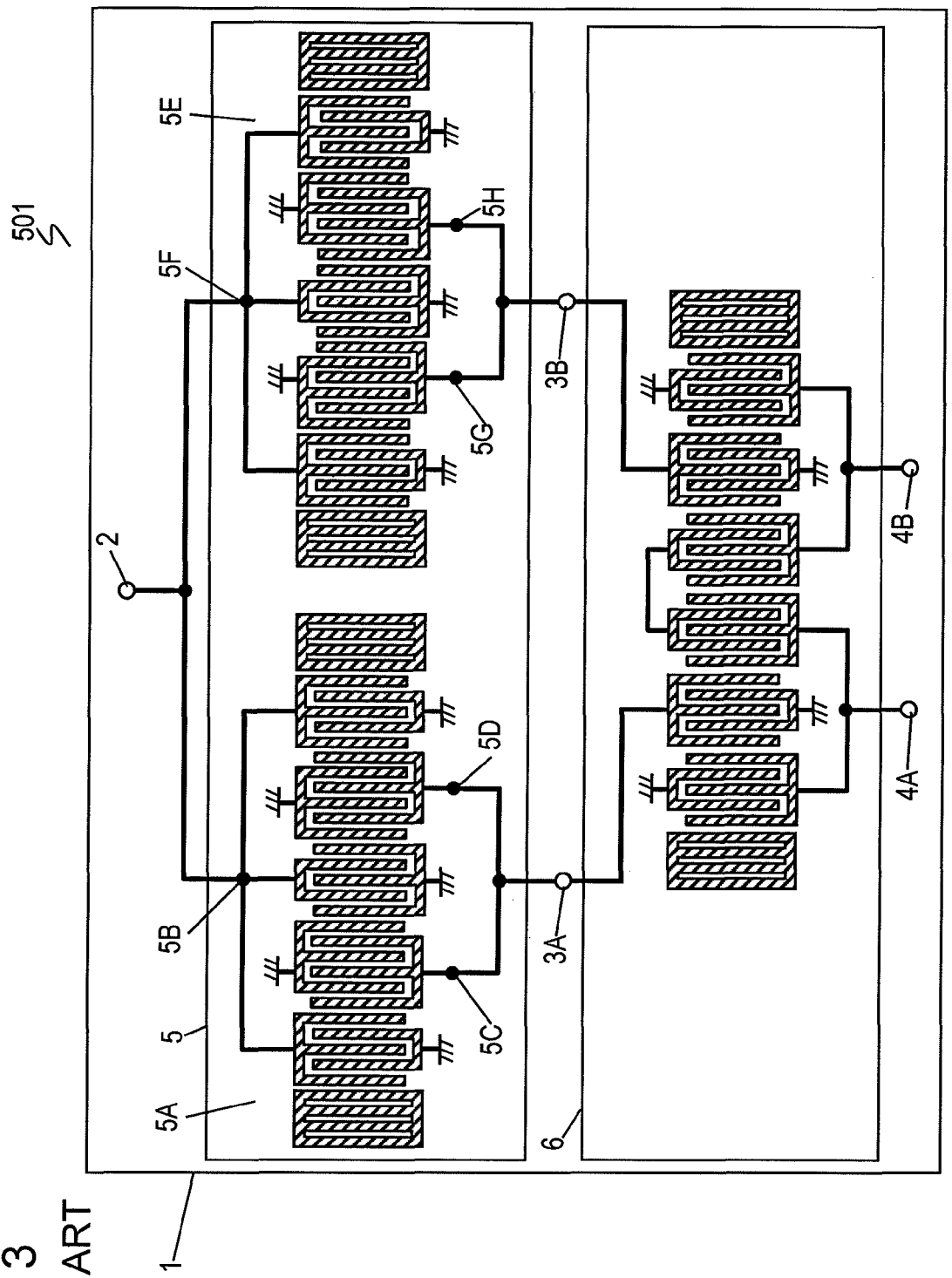
FIG. 13 is a schematic view of a conventional SAW filter device.
Figure 14:
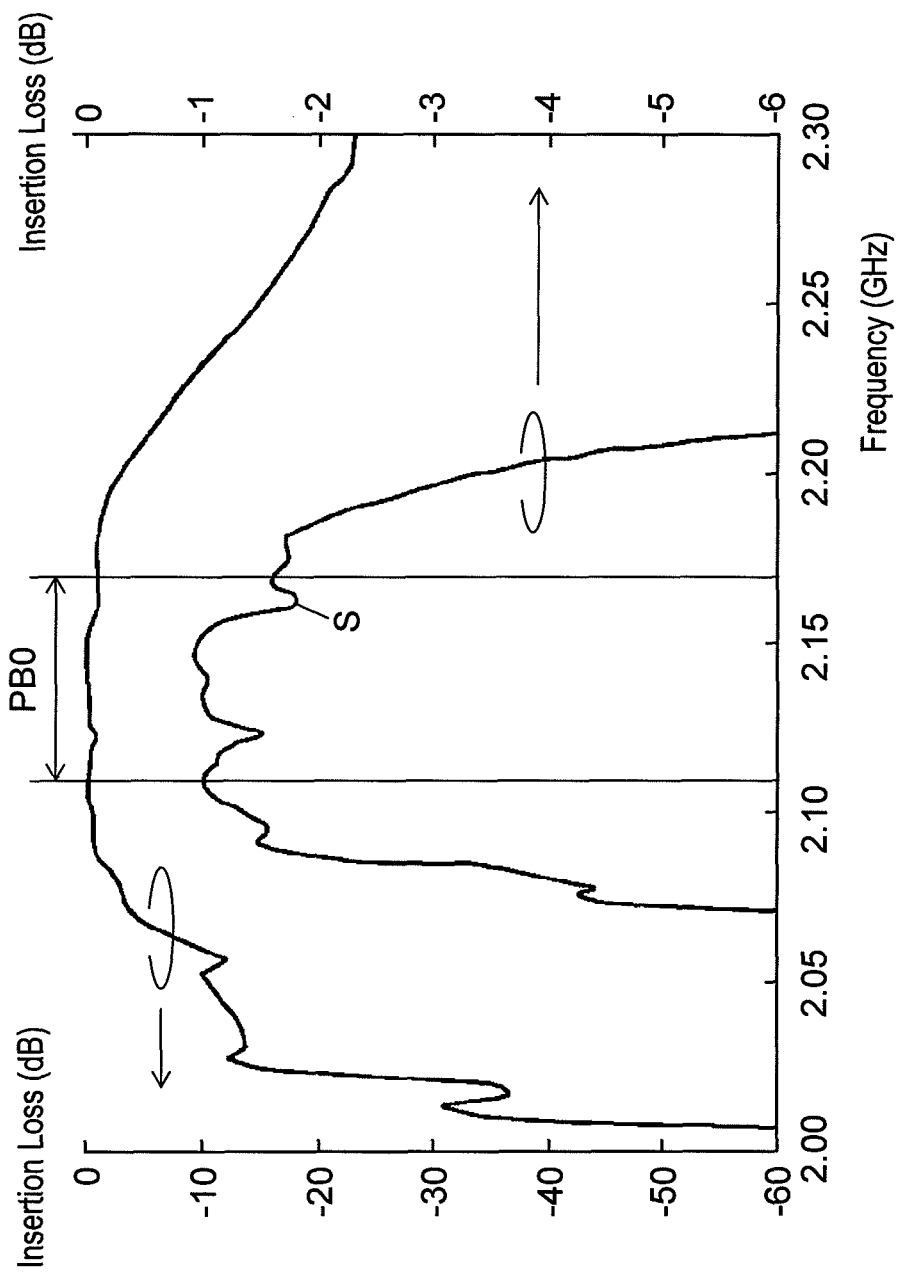
FIG. 14 illustrates propagation characteristics of a conventional SAW filter in the conventional SAW filter device.

FIG. 2 illustrates a profile 201 of the SAW filter 15 and a profile 202 of the conventional SAW filter device 501 shown in FIG. 13.

As shown in FIG. 2, the profile 201 of the SAW filter 15 according to Embodiment 1 exhibits the spurious S successfully suppressed in the high frequencies and the insertion loss reduced throughout the desired pass band PB ranging from 2.11 GHz to 2.17 GHz. More specifically, the insertion loss at 2.17 GHz in the high frequencies is 1.8 dB in the profile 202 of the conventional SAW filter 5, and is 1.4 dB in the profile 201 of the SAW filter 201 according to Embodiment 1 which is improved.

The SAW filter device 10 including the SAW filter 15 having the profile 201 shown in FIG. 2 and the SAW filter 16 connected in series to the SAW filter 15 can improve the performance of attenuation outside the desired pass band PB.

Figure 3:
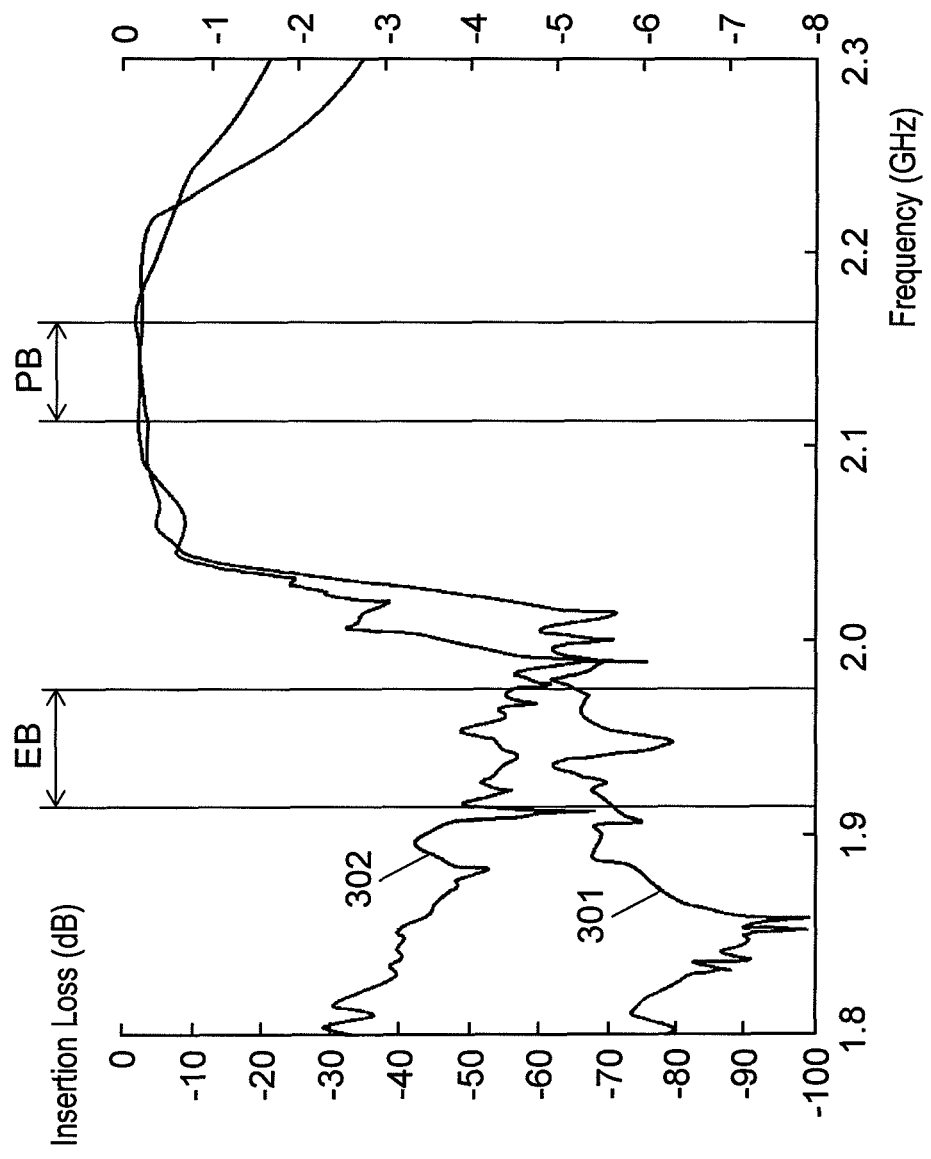
FIG. 3 illustrates propagation characteristics of the SAW filter device according to Embodiment 1.

FIG. 3 illustrates propagation characteristics of the SAW filter device 10. FIG. 3 illustrates a profile 301 of the SAW filter device 10 and a profile 302 of the SAW filter 15.

As shown in FIG. 3, the profile 301 of the SAW filter device 10 exhibits an attenuation larger than the profile 302 of the SAW filter 15 in an elimination band EB ranging from 1.92 GHz to 1.98 GHz which is outside of pass band PB.

The SAW filter device 10 according to Embodiment 1 can maintain an attenuation in the elimination band EB while suppressing the spurious in high frequencies in the desired pass band PB and reducing the insertion loss.

Electrode finger 415A located at the outermost end of the IDT electrodes 17C, 17D, 17E, 17F, 17G of the SAW resonator 15A preferably has a polarity identical to a polarity of electrode finger 415E located at the outermost end of the IDT electrodes 18C, 18D, 18E, 18F, and 18G of the SAW resonator 15E. These polarities are provided by making the arrangement of the comb-shaped electrodes 117C, 117D, 117E, 117F, 117G, 217C, 217D, 217E, 217F, and 217G of the IDT electrodes 17C, 17D, 17E, 17F, and 17G of the SAW resonator 15A equal to the arrangement of the comb-shaped electrodes 118C, 118D, 118E, 118F, 118G, 218C, 218D, 218E, 218F, and 218G of the IDT electrodes 18C, 18D, 18E, 18F, and 18G of the SAW resonator 15E. For example, the arrangement of the comb-shaped electrodes 117C, 117D, 117E, 117F, and 117G of the IDT electrodes 17C, 17D, 17E, 17F, and 17G of the SAW resonator 15A is equal to the arrangement of the comb-shaped electrodes 118C, 118D, 118E, 118F, and 118G of the IDT electrodes 18C, 18D, 18E, 18F, and 18G of the SAW resonator 15E while the arrangement of the comb-shaped electrodes 217C, 217D, 217E, 217F, and 217G of the IDT electrodes 17C, 17D, 17E, 17F, 17G of the SAW resonator 15A is equal to the arrangement of the comb-shaped electrodes 218C, 218D, 218E, 218F, and 218G of the IDT electrodes 18C, 18D, 18E, 18F, and 18G of the SAW resonator 15E. This structure allows the phase of the signals output from the balanced signal output port 15C to be equal the phase of the signals output from the balanced signal output port 15G, and causes the phase of the signals output from the balanced signal output port 15D to be equal to the phase of the signals output from the balanced signal output port 15H.

The piezoelectric substrate 11 may be made of a Y-cut, X-propagating LiNbO$_3$ substrate, a LiNbO$_3$ substrate cut by a certain angle, a LiTaO$_3$ substrate, or any other piezoelectric substrate, such as a quartz crystal substrate.

The IDT electrodes and reflectors provided on the piezoelectric substrate 11 can be made of single metal, such as aluminum, copper, silver, gold, titanium, tungsten, paradigm, chromium, or molybdenum, or alloy of them, or laminated structure.

The overlapping width L1 along which the electrode fingers of the comb-shaped electrodes of the SAW resonator 15A overlap interdigitally is larger than the overlapping width L2 along which the electrode fingers of the comb-shaped electrodes of the SAW resonator 15E overlaps interdigitally. This structure allows frequencies at which transverse mode spurious occur to be effectively dispersed.

In the SAW filter device 10 shown in FIG. 1, each of the SAW resonators 15A, 15E includes five IDT electrodes arranged in the direction along which the surface acoustic waves propagate, but the number of the IDT electrodes may not limited to five.

Figure 4:
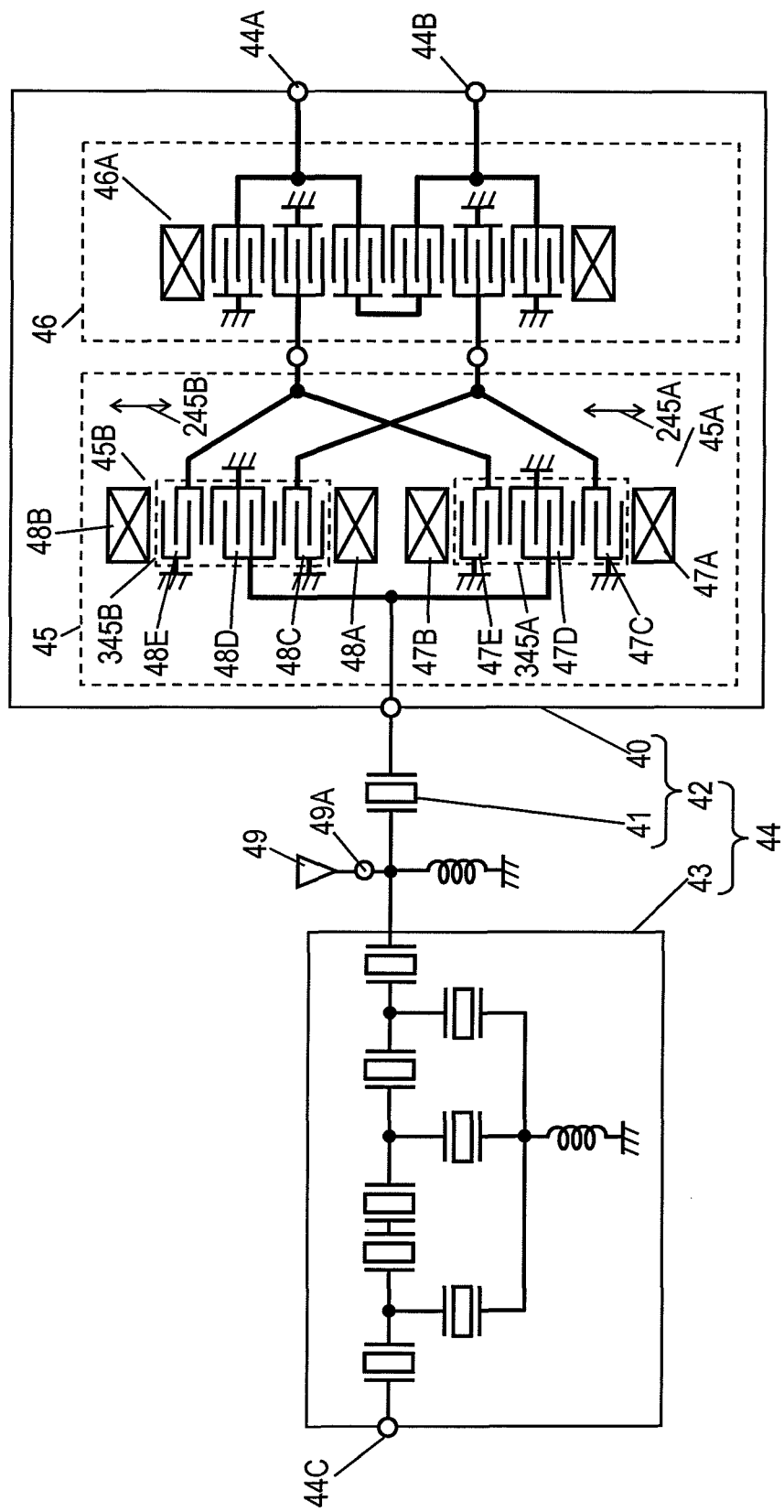
FIG. 4 is a schematic view of a receiver filter and a duplexer according to Embodiment 1.

FIG. 4 is a schematic view of a duplexer 44 including a receiver filter 42 a SAW filter device 40 according to of Embodiment 1. The SAW filter device 40 includes SAW filters 45 and 46. The SAW filter 45 includes longitudinally-coupled SAW resonators 45A and 45B. The SAW filter 46 includes longitudinally-coupled SAW resonator 46A.

The SAW resonator 45A includes three IDT electrodes 47C, 47D, and 47E which are arranged in a direction 245A along which a surface acoustic wave propagates in the surface acoustic wave propagating region 345A. Grating reflectors 47A and 47B are located at both outsides, in the direction 245A, of the surface acoustic wave propagating regions 345A where the IDT electrodes 47C, 47D, and 47E are arranged. The SAW resonator 45B includes three IDT electrodes 48C, 48D, and 48E which are arranged in a direction 245B along which a surface acoustic wave propagates in the surface acoustic wave propagating region 345B. Grating reflectors 48A and 48B are located at both outsides, in the direction 245B, of the surface acoustic wave propagating region 345B where the IDT electrodes 48C, 48D, 48E are arranged. The SAW resonator 46A has a structure identical to that of the SAW resonator 16A of the SAW filter device 10 shown in FIG. 1. This structure decreases the overall size of the SAW filter device 40.

The receiver filter 42 includes the SAW filter device 40 and a resonator 41 connected to the previous stage of the SAW filter device 40. The receiver filter 42 filters unbalanced signals received from an antenna 49, converts the signals to a pair of balanced signals, and output the balanced signals from a pair of output ports 44A and 44B. The receiver filter 42 can suppress spurious at high frequencies in the desired frequency band and reduce an insertion loss.

The duplexer 44 includes the receiver filter 42, an antenna terminal 49A connected to the receiver filter, and a transmitter filter 43 connected to the antenna terminal 49A. The antenna terminal 49A of the duplexer 44 is adapted to be connected with the antenna 49. A signal received at the antenna 49 are filtered by the receiver filter 42 and output from a pair of output ports 44A and 44B while the signals received at an input port 44C are filtered by the transmitter filter 43 and output from the antenna 49. The transmitter filter 43 may be, for example, a ladder filter which has plural resonators connected in a ladder form.

In the SAW filter device 10 shown in FIG. 1, the phase of the input and output signals at the input/output port 13A is reversed to the phase of the input and output signals at the input/output port 13B. These phases may be equal to each other. This arrangement reduces a parasitic capacitance produced at an intersection of a line connected to the input/output port 13A and a line connected to the input/output port 13B.

Figure 5B:
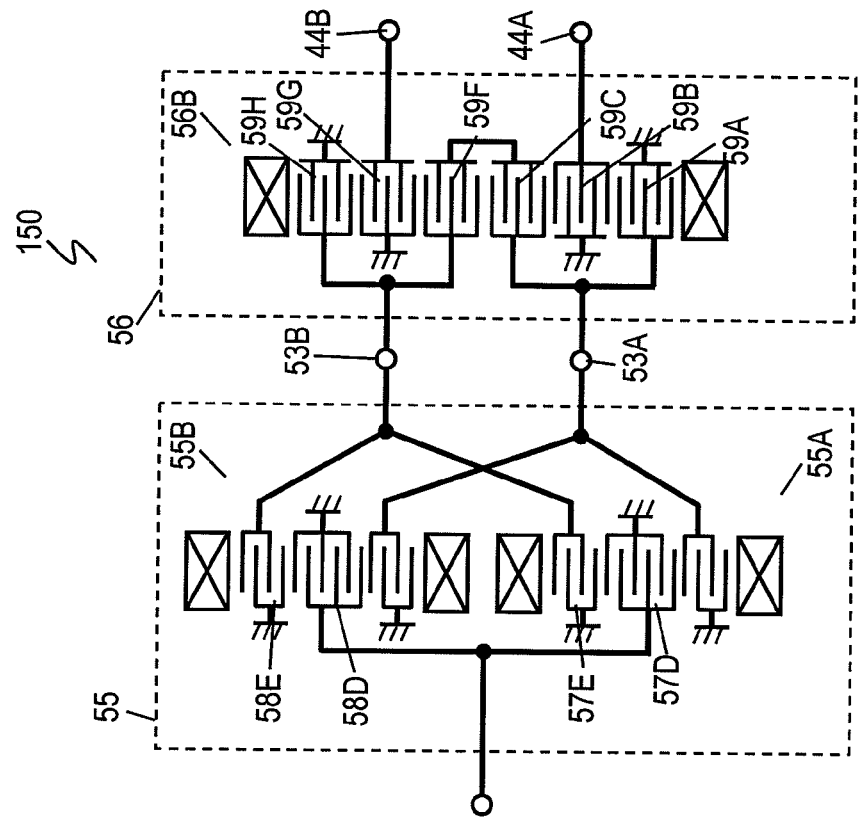
FIG. 5B is a schematic view of a further SAW filter device according to Embodiment 1.
Figure 5A:
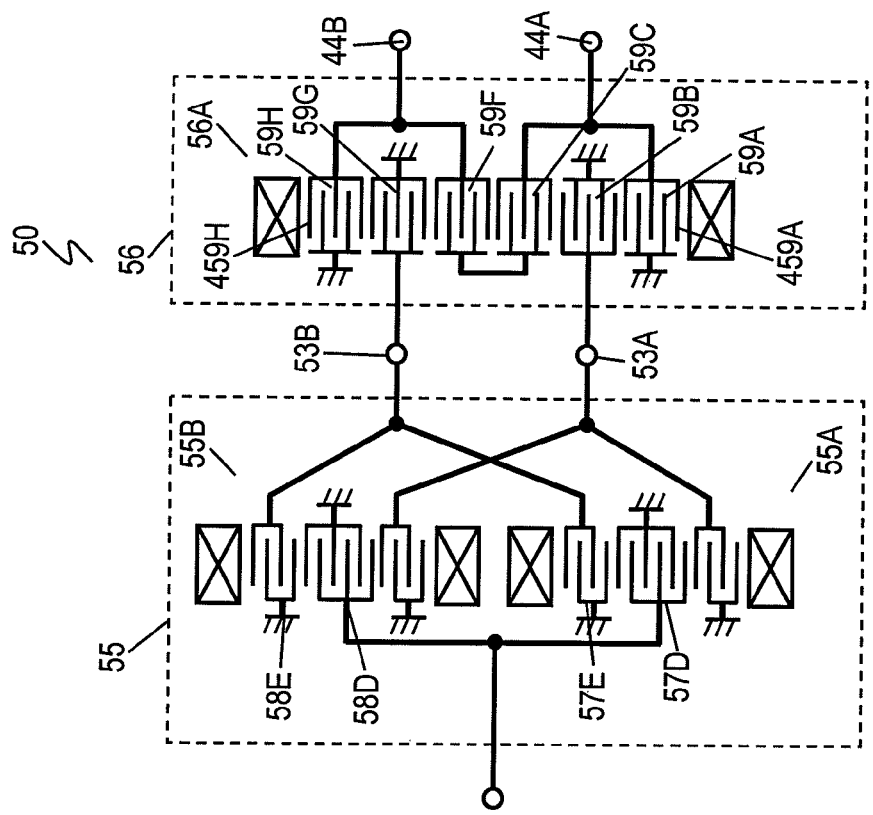
FIG. 5A is a schematic view of another SAW filter device according to Embodiment 1.

FIG. 5A is a schematic view of another SAW filter device 50 according to Embodiment 1. The SAW filter device 50 includes SAW filters 55 and 56. The SAW filter 55 includes longitudinally-coupled SAW resonators 55A and 55B. The SAW filter 56 includes a longitudinally-coupled SAW resonator 56A.

The SAW filter device 50 is different from the SAW filter device 40 shown in FIG. 4 as follows. An electrode finger of a grounded comb-shaped electrode of an IDT electrode 57E is located adjacent to an electrodes finger of a grounded comb-shaped electrode of an IDT electrode 57D. Further, an electrode finger of a grounded comb-shaped electrode of an IDT electrode 58E is located adjacent to an electrodes finger of a grounded comb-shaped electrode of an IDT electrode 58D. In addition, an electrode finger of a grounded comb-shaped electrode of an IDT electrode 59G is located adjacent to electrodes fingers of comb-shaped electrodes of IDT electrodes 59F and 59H both connected to an output port 44B. A comb-shaped electrode of an IDT electrode 59H having an outermost electrode finger and one of the comb-shaped electrodes of an IDT electrode 59F are connected to the output port 44B while one of the comb-shaped electrodes of an IDT electrode 59G is connected to an input/output port 53B. A comb-shaped electrode of an IDT electrode 59A having an outermost electrode finger and one of comb-shaped electrodes of an IDT electrode 59C are connected to an output port 44A while one of comb-shaped electrodes of an IDT electrode 59B is connected to the input/output port 53B.

This arrangement allows the phase of the input and output signals at the input/output port 53A to be equal to the phase of the input and output signals at the input/output port 53B, and causes the phase of the signals output from the output port 44A to be reversed to the phase of the signals output from the output port 44B.

FIG. 5B is a schematic view of a further SAW filter device 150 according to Embodiment 1. In FIG. 5B, components identical to those of the SAW filter device 50 shown in FIG. 5A are denoted by the same reference numerals. The SAW filter device 150 includes a longitudinally-coupled SAW resonator 56B instead of the longitudinally-coupled SAW resonator 56A shown in FIG. 5A. The SAW resonator 56B includes comb-shaped electrodes arranged in opposite to the comb-shaped electrodes of the SAW resonator 56A shown in FIG. 5A. More specifically, the comb-shaped electrode of an IDT electrode 59H having an outermost electrode finger and one of comb-shaped electrodes of an IDT electrode 59F are connected to an input/port 53B while one of comb-shaped electrodes of an IDT electrode 59G is connected to an output port 44B. A comb-shaped electrode of an IDT electrode 59A having an outermost electrode finger and one of comb-shaped electrodes of an IDT electrode 59C are connected to an input/output port 53A while one of comb-shaped electrodes of an IDT electrode 59B is connected to the output port 44A. This arrangement of the longitudinally coupled type SAW resonator 56B performs impedance matching easily.

Figure 6:
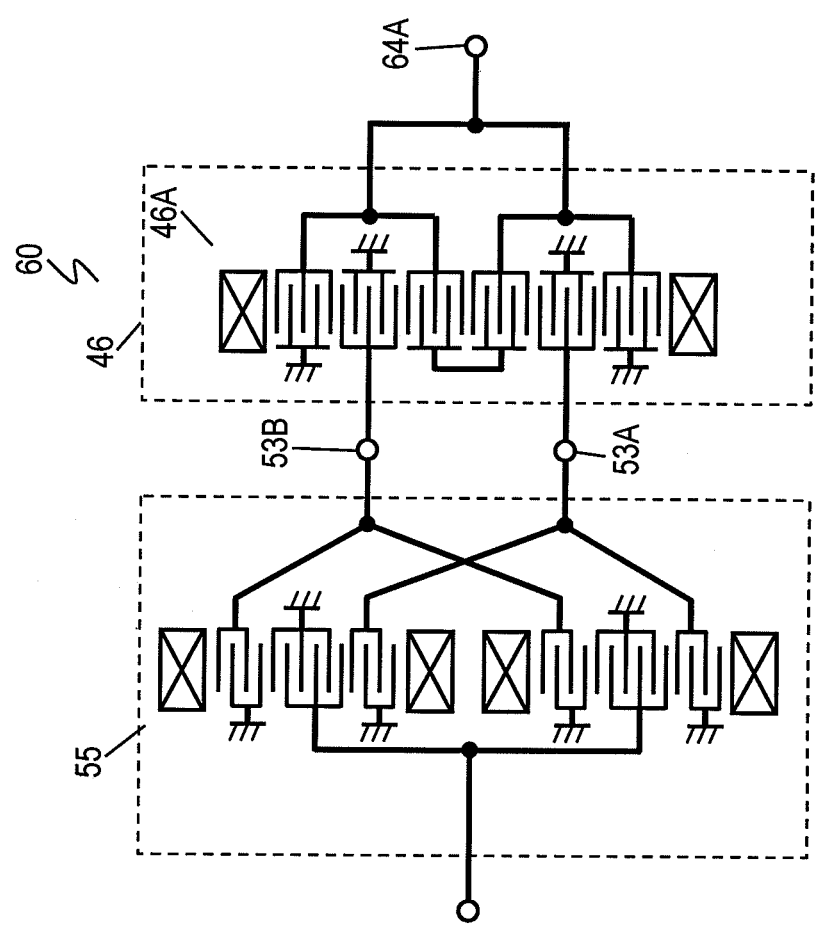
FIG. 6 is a schematic view of a further SAW wave filter device according to Embodiment 1.

FIG. 6 is a schematic view of a further SAW filter device 60 according to Embodiment 1. As shown in FIG. 6, the SAW filter device 60 includes the SAW filter 55 shown in FIGS. 5A and 5B and the SAW filter 46 shown in FIG. 4. The SAW filter device 60 allows the phase of the input and output signals at the input/output port 53A to be equal to the phase of the input and output signals at the input/output port 53B, thus outputting unbalanced signals can from the output port 64A. The SAW filter device 60 can suppress spurious at high frequencies of the desired frequency band, and reduce an insertion loss.

Figure 7:
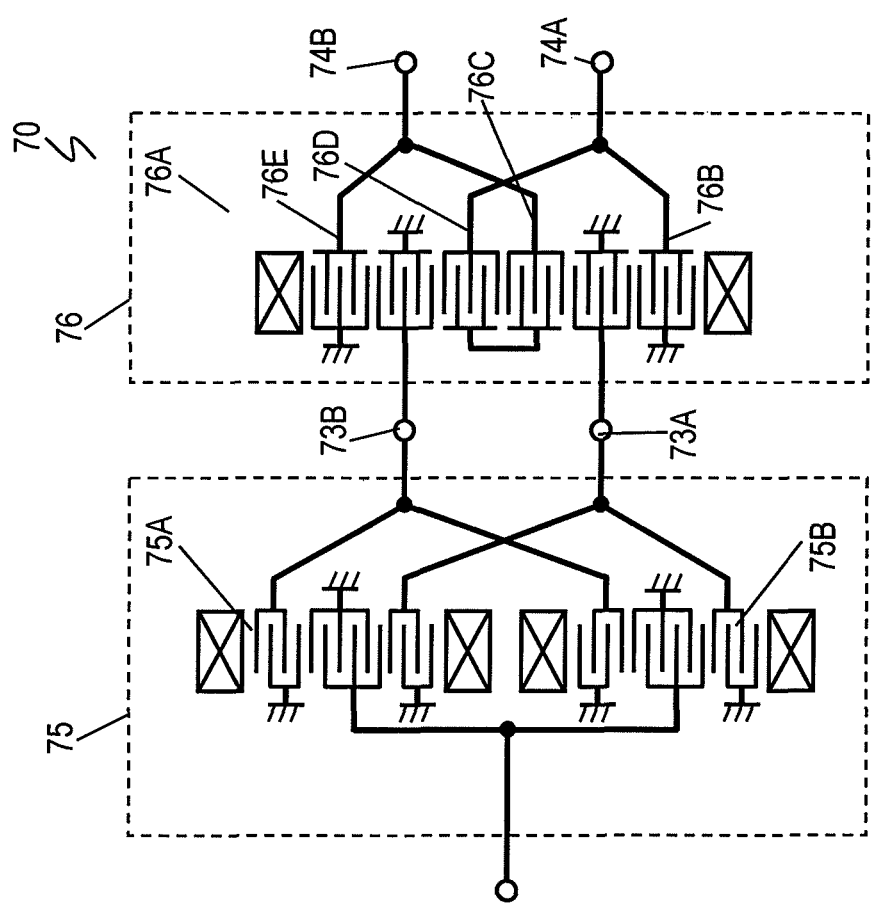
FIG. 7 is a schematic view of a further SAW filter device according to Embodiment 1.

FIG. 7 is a schematic view of a further SAW filter device 70 according to Embodiment 1. The SAW filter device 70 includes SAW filters 75 and 76. Wirings connected to outputs of the SAW filter 75 cross each other while wirings connected to outputs of the SAW filter 76 cross each other. The SAW filter 75 includes longitudinally-coupled SAW resonators 75A and 75B. Each of SAW resonators 75A and 75B includes a pair of balanced signal output lines for outputting a pair of balanced signals, respectively. The balanced signal output lines of the SAW resonators 75A and 75B are connected to a pair of input/output ports 73A and 73B while one of the pair of balanced signal output lines of the SAW resonator 75A and one of the pair of balanced signal output lines of the SAW resonator 75B cross each other. The SAW filter 76 includes a longitudinally-coupled SAW resonator 76A which includes two pairs of balanced signal output lines for outputting two pairs of balanced signals, that is, four output lines 76B, 76C, 76D, and 76E. The output lines 76B, 76D are connected to an output port 74A while the output lines 76C and 76E are connected to an output port 74B. The SAW filter device 70 can suppress spurious at high frequencies of the desired frequency band and reduce an insertion loss.

Exemplary Embodiment 2

Figure 8:
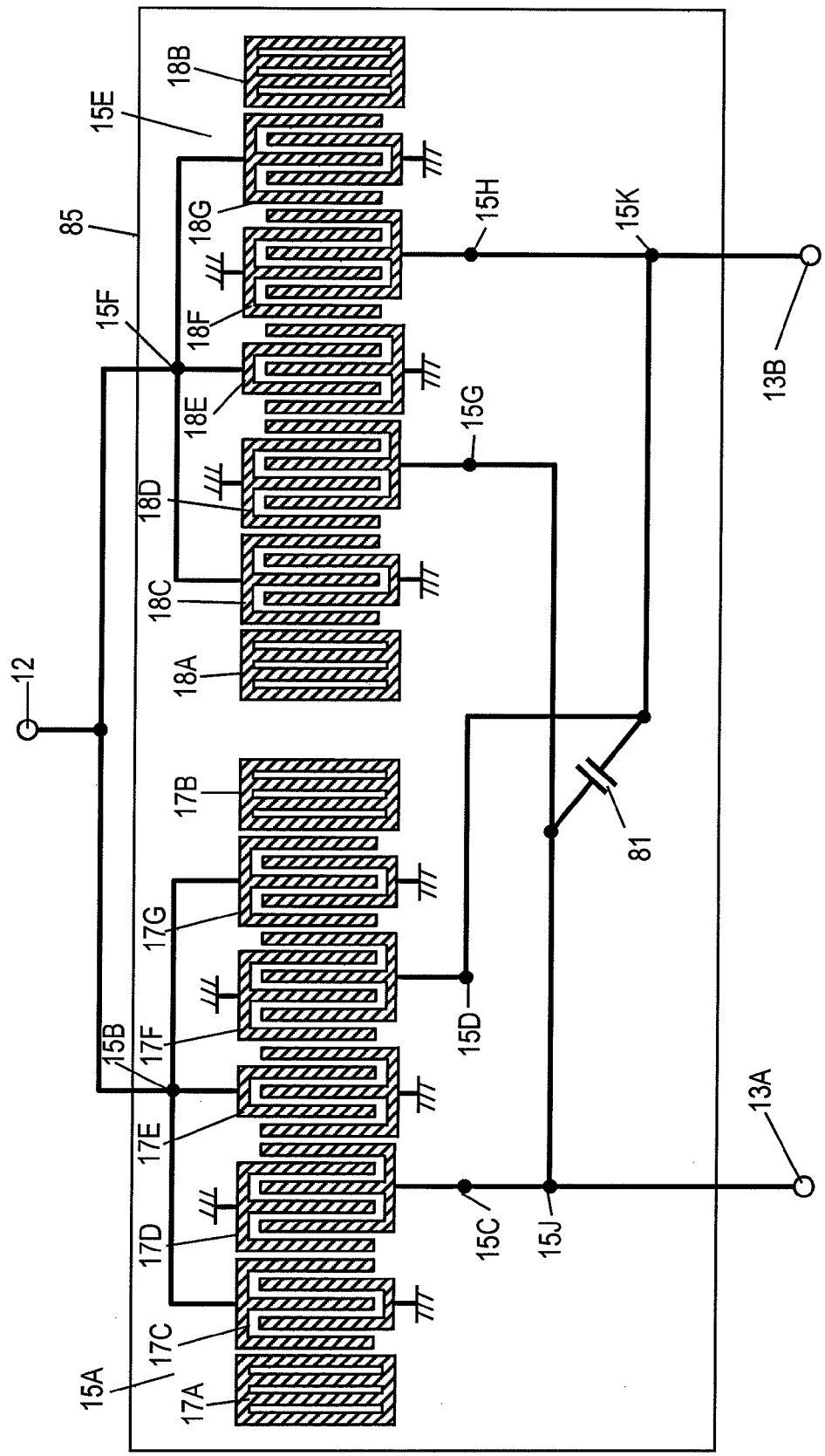
FIG. 8 is a schematic view of a SAW filter in a SAW filter device according to Exemplary Embodiment 2 of the invention.

FIG. 8 is a schematic view of a surface acoustic wave (SAW) filter 85 of a SAW filter device according to Exemplary Embodiment 2 of the present invention. In FIG. 8, components identical to those of the SAW filter device 10 according to Embodiment 1 shown in FIG. 1 are denoted by the same reference numerals. The SAW filter 16 and the pair of output ports 14A, 14B of the SAW filter device 10 are not illustrated in FIG. 8. The SAW filter 85 further includes a capacitance element 81 connected between a wiring connecting from the node 15J to the balanced signal output port 15G and a wiring connecting from the node 15K to the balanced signal output port 15D of the SAW filter 15 according to Embodiment 1.

Figure 9:
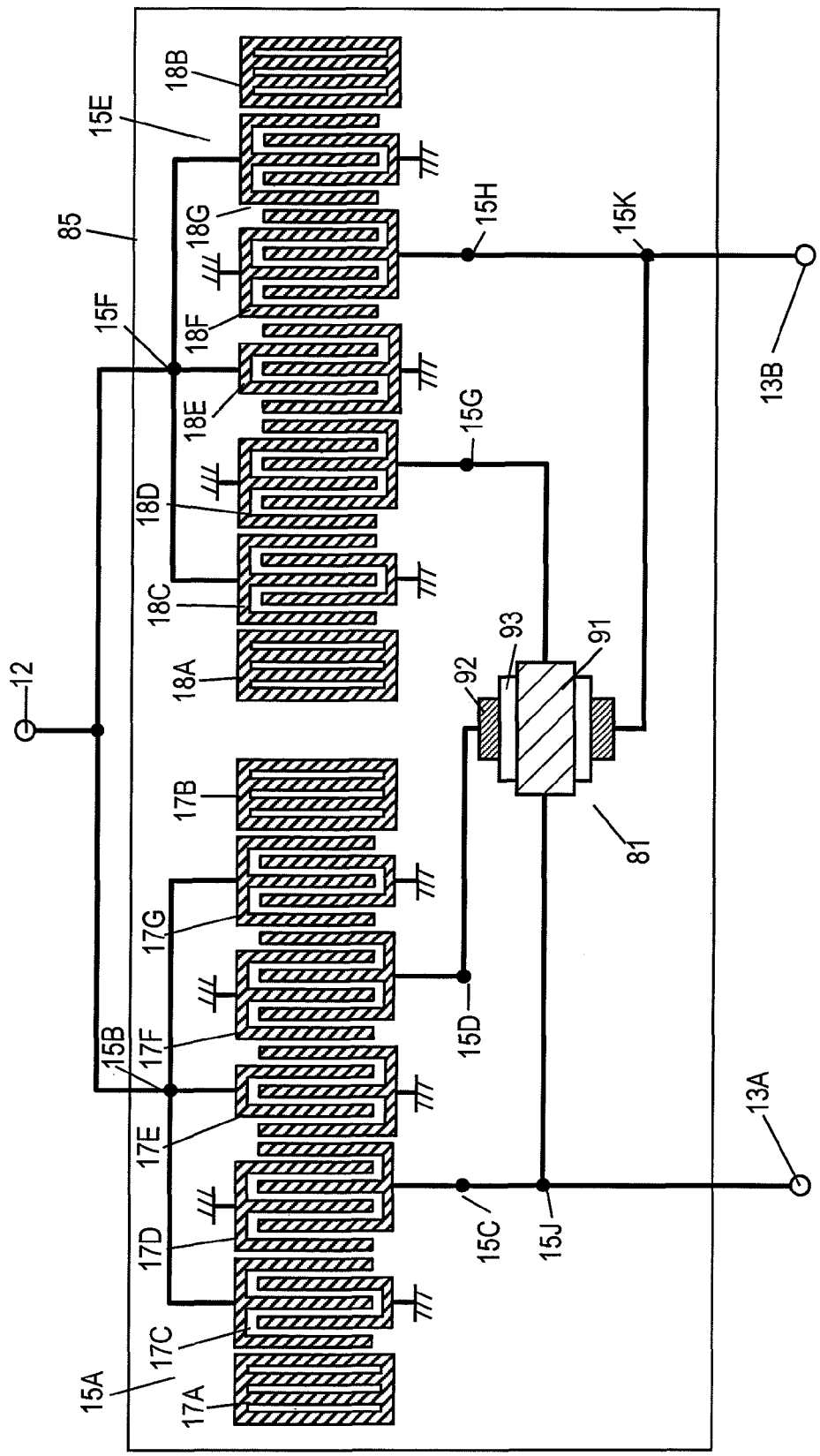
FIG. 9 is a top view of the SAW filter device according to Embodiment 2.

FIG. 9 is a top view of the SAW filter 85 shown in FIG. 8. The wiring 91 connects from the balanced signal output port 15G to the node 15J. The wiring 92 connects between the balanced signal output port 15D and the node 15K. The wiring 91 is connected between the balanced signal output port 15G and the node 15J at which the balanced signal output port 15C is connected with the input/output port 13A, one of the pair of input/output ports 13A and 13B. The wiring 92 is connected between the balanced signal output port 15D and the node 15K at which the balanced signal output port 15H is connected with the input/output port 13B, another of the input/output ports 13A and 13B.

Figure 10A:
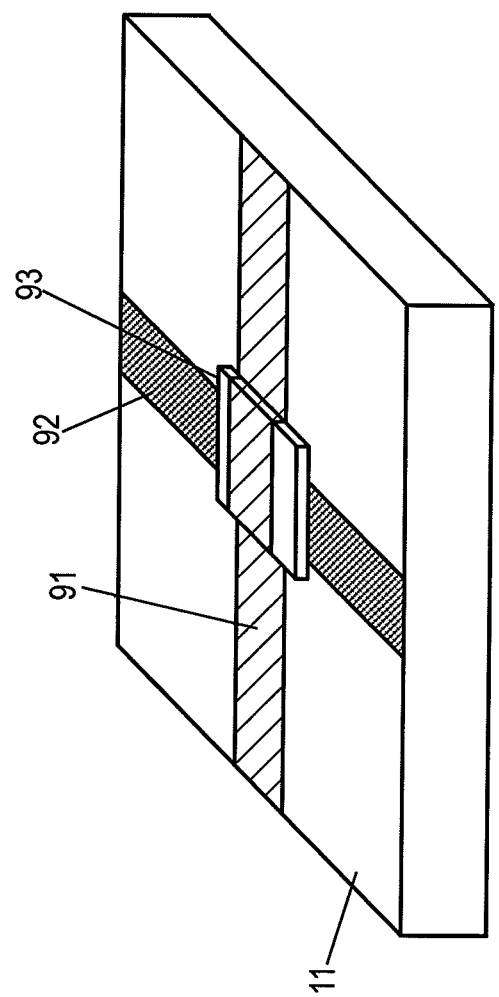
FIG. 10A is a perspective view of the SAW filter device according to Embodiment 2.

FIG. 10A is a perspective view of the SAW filter 85 for illustrating the capacitance element 81. The wirings 91 and 92 are located on the piezoelectric substrate 11 so as to cross and face each other across a dielectric film 93 thus forming the capacitance element 81. The capacitance element 81 allows the impedance of the SAW filter 85 to match viewing from the pair of input/output ports 13A and 13B.

The dielectric film 93 may preferably be made of silicon oxide film. The silicon oxide film can be fabricated at a low temperature, accordingly preventing the filter 85 from damaging. The dielectric film 93 can be fabricated accurately, have high quality, and facilitated to control the thickness.

Figure 10B:
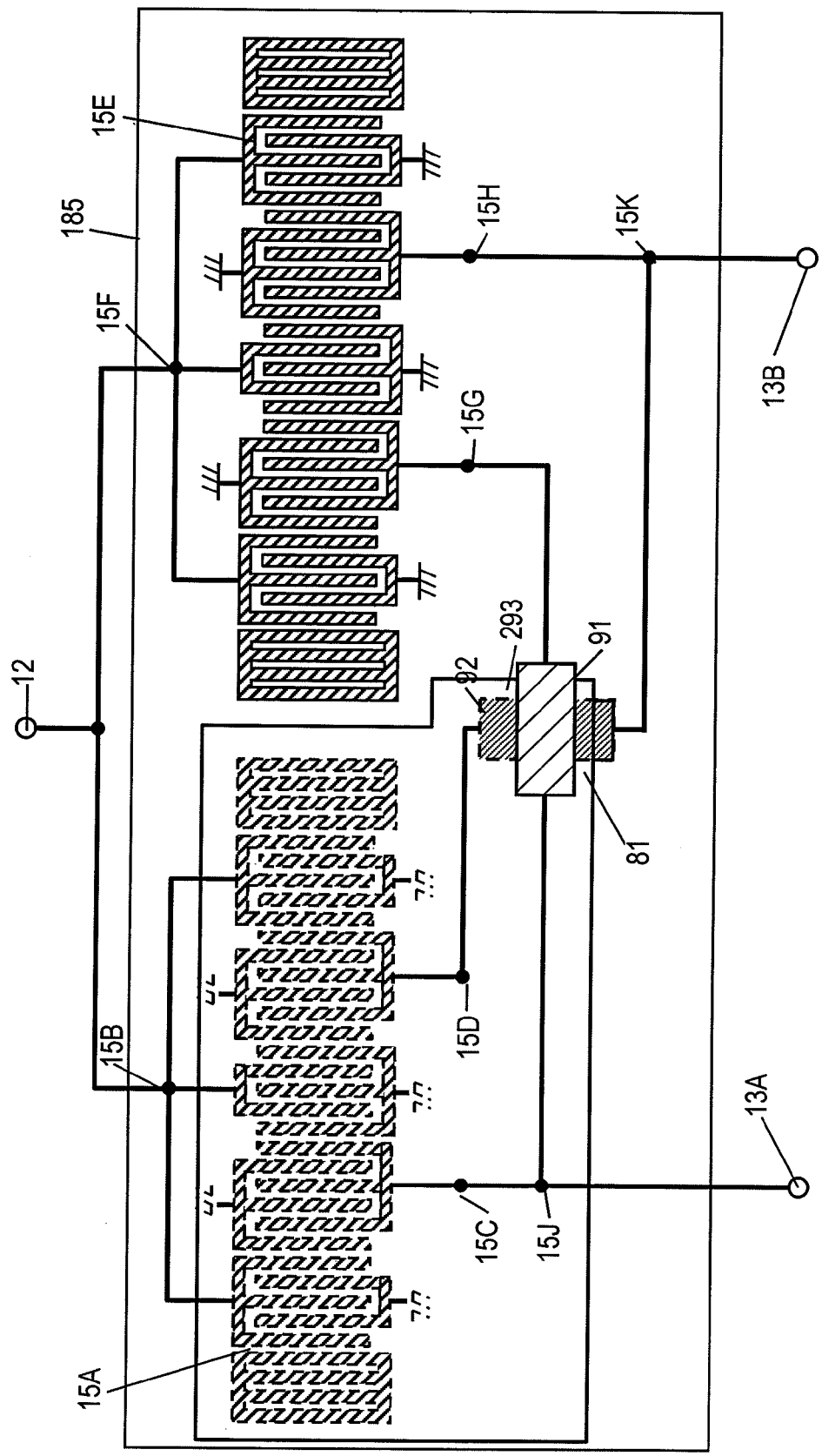
FIGS. 10B to 10D are top views of SAW filters according to Embodiment 2.

FIG. 10B is a top upper view of another SAW filter 185 according to Embodiment 2. In FIG. 10B, components identical to those of the SAW filter 85 shown in FIG. 9 are denoted by the same reference numerals. The SAW filter 185 includes a dielectric film 193 made of the same material as the dielectric film 93 instead of the dielectric film 93 of the SAW filter 85 shown in FIG. 9. Wirings 91 and 92 cross and face each other across the dielectric film 193. The dielectric film 193 extends to cover the upper surface of the SAW resonator 15A while acting as a functional layer on the SAW resonator 15A.

Figure 10C:
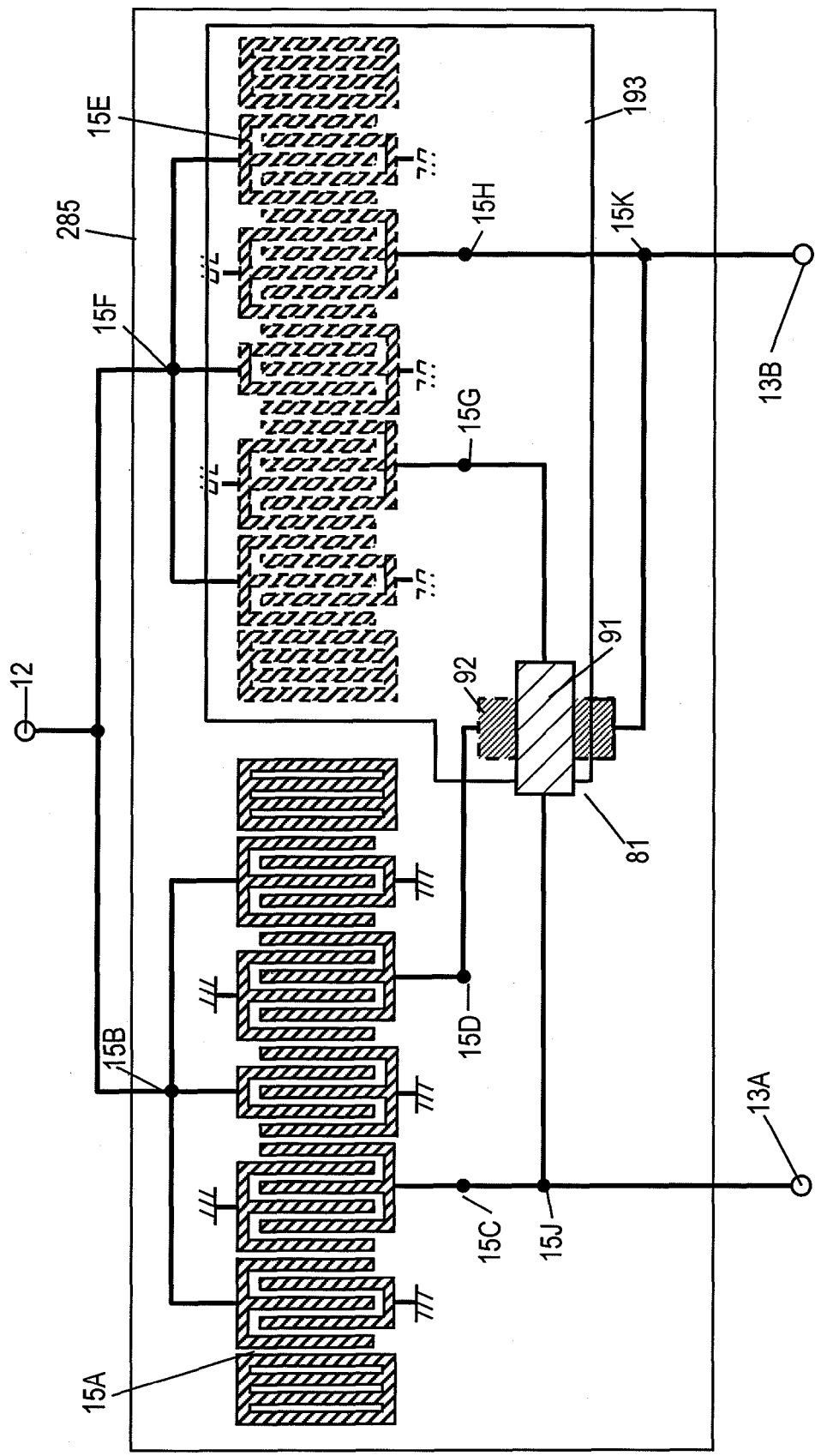

FIG. 10C is a top view of a further SAW filter 285 according to Embodiment 2. In FIG. 10C, components identical to those of the SAW filter 85 shown in FIG. 9 are denoted by the same reference numerals. The SAW filter 285 includes a dielectric film 293 made of the same material as the dielectric film 93 instead of the dielectric film 93 of the SAW filter 85 shown in FIG. 9. Wirings 91 and 92 face each other and sandwich the dielectric film 293 between the wirings. The dielectric film 293 extends to cover the upper surface of the SAW resonator 15E while acting as a functional layer on the SAW resonator 15E.

Figure 10D:
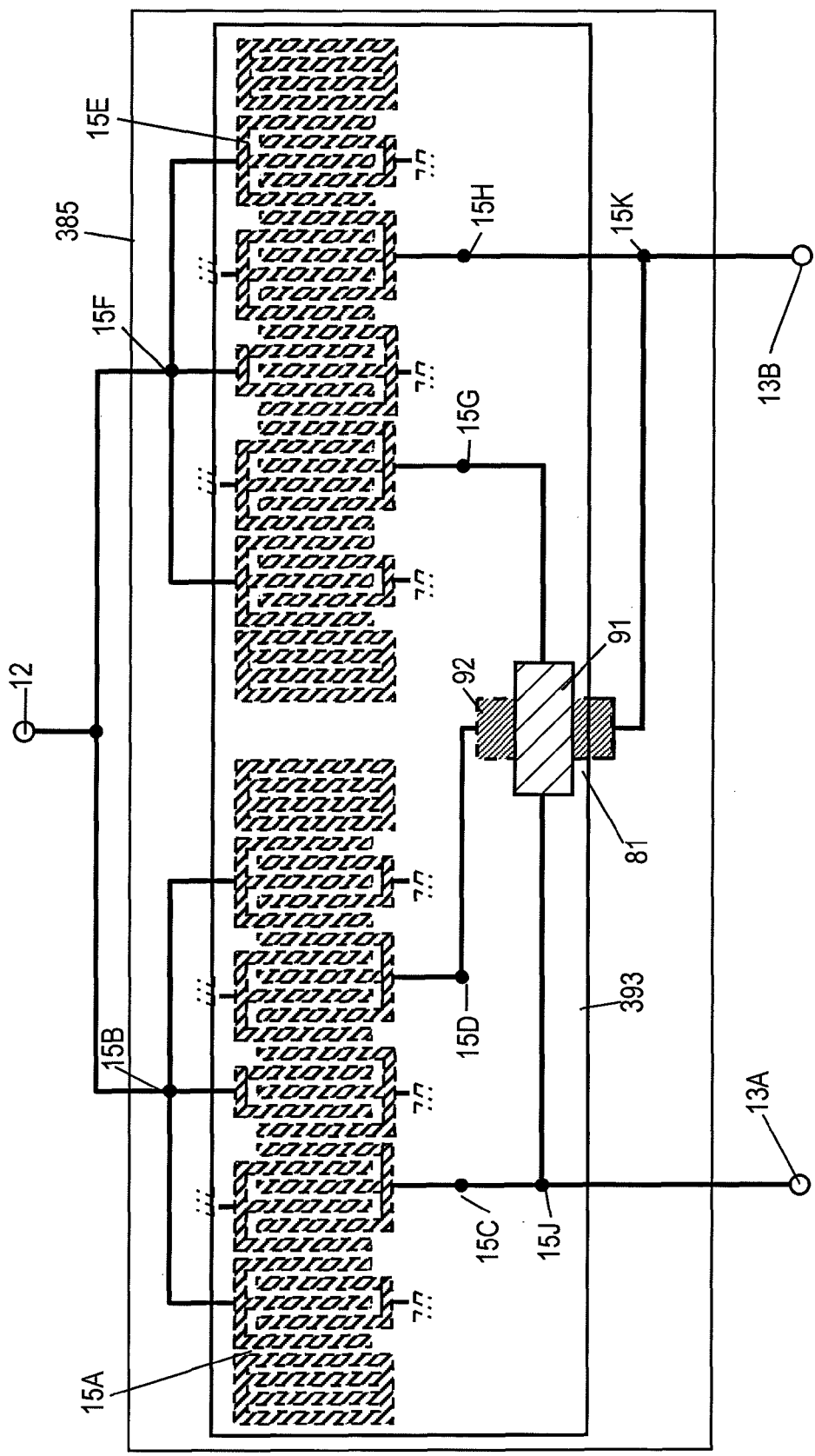

FIG. 10D is a top view of a further SAW filter 385 according to Embodiment 2. In FIG. 10D, components identical to those of the SAW filter 85 shown in FIG. 9 are denoted by the same reference numerals. The SAW filter 385 includes a dielectric film 393 made of the same material of the dielectric film 93 instead of the dielectric film 93 of the SAW filter 85 shown in FIG. 9. Wirings 91 and 92 face each other and sandwich the dielectric film 393 between the wirings. The dielectric film 393 extends to cover the upper surface of each of the SAW resonators 15A and 15E while acting as a functional layer on the SAW resonators 15A and 15E.

As described above, the dielectric film 93 (193, 293, 393) extends to cover the upper surface of at least one of the SAW resonator 15A and 15E while acting as a functional layer on the at least one of the SAW resonators 15A and 15E.

More specifically, the dielectric film 93 extends to cover the IDT electrodes 17C, 17D, 17E, 17F, and 17G and/or the IDT electrodes 18C, 18D, 18E, 18F, and 18G and acts as a functional layer for those electrodes.

For example, the IDT electrodes 17C, 17D, 17E, 17F, 17G, 18C, 18D, 18E, 18F, and 18G are covered and protected at the upper surface with the functional layer made of, e.g., silicon oxide (the dielectric films 93, 193, 293, 393) which serve as a protective layer. The functional layer can suppress undesired spurious generated at resonant frequencies and improve the frequency temperature property. The functional layer may extend to cover the wirings 91 and 92 located away from the IDT electrodes to allow the dielectric film 93 to act as the functional layer, hence increasing the productivity of the filter.

The piezoelectric substrate 11 made of LiTaO$_3$ generates small undesired spurious generated at the resonant frequencies, and allows the dielectric film 93 (193, 293, 393) to be made of resin material, such as polyimide, which is preferable for fabricating processes while acting as the functional layer.

The SAW filter 16 shown in FIG. 1 may include a capacitance element made of dielectric film similar to the dielectric film 93 sandwiched between a wiring connecting the balanced signal output port 16D with the output port 14A and a wiring of connecting the balanced signal output port 16E with the output port 14B such that the wirings face each other across the dielectric film.

Exemplary Embodiment 3

Figure 11:
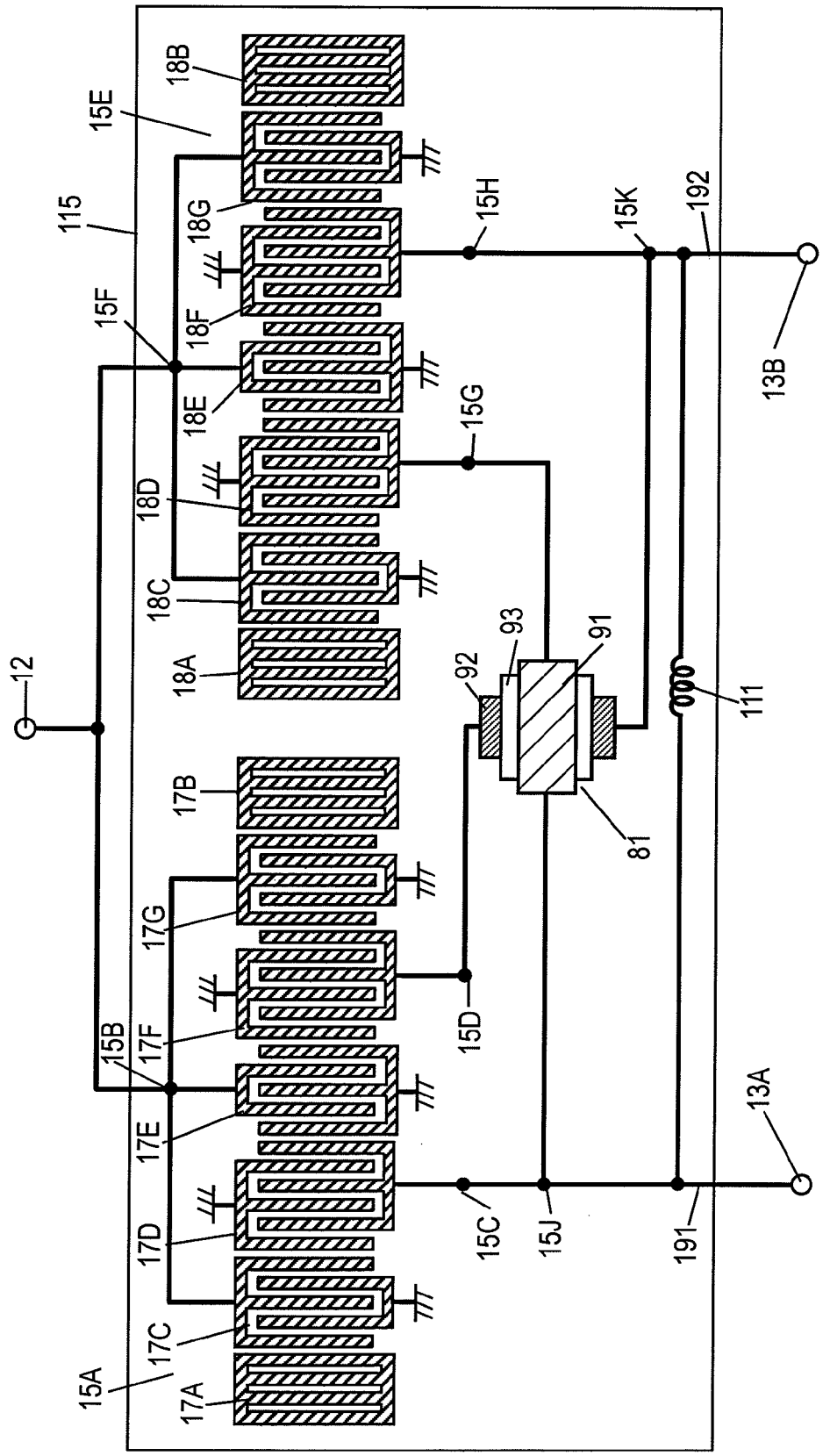
FIG. 11 is a schematic view of a SAW filter of a SAW filter device according to Exemplary Embodiment 3 of the invention.

FIG. 11 is a schematic view of a surface acoustic wave (SAW) filter 115 of a SAW filter device according to Exemplary Embodiment 3 of the present invention. In FIG. 11, components identical to those of the SAW filter device 85 according to Embodiment 2 shown in FIG. 9 are denoted by the same reference numerals. The SAW filter 115 further includes an inductance element 111 connected between a siring 191 connecting from the node 15J to the input/output port 13A and a wiring 192 connecting from the node 15K to the input/output port 13B of the surface acoustic wave filer 85 according to Embodiment 2 shown in FIG. 9.

The inductance element 111 may be implemented by a laminated inductor or a thin film inductor which is electrically connected between the two input/output ports 13A and 13B.

The inductance element 111 allows the impedance of the SAW filter 115 to match viewing from the input/output ports 13A and 13B. Since the capacitance of the capacitance element 81 essential for the impedance matching is small, the area where the wirings 91 and 92 cross can be small, hence providing the filter 115 with a small size.

Alternatively, in the SAW filter 16 shown in FIG. 1, an inductance may be connected between the wiring connecting from the balanced signal output port 16D to the output port 14A and the wiring connecting from the balanced signal output port 16E to the output port 14B.

Figure 12:
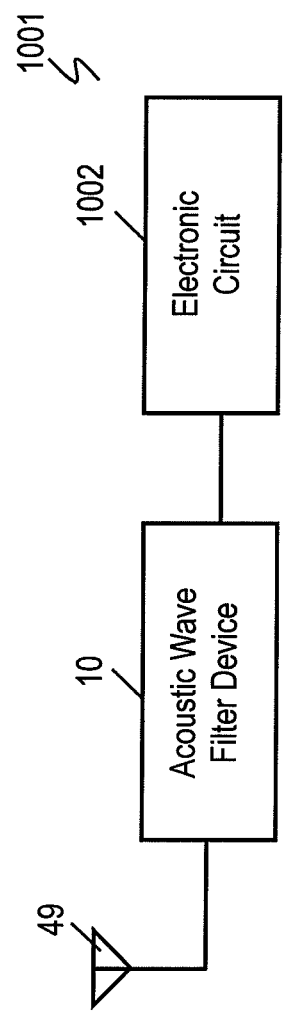
FIG. 12 is a block diagram of an electronic apparatus including the SAW filter device according to Embodiments 1 to 3.

FIG. 12 is a block diagram of an electronic apparatus 1001 including the SAW filter device according to Embodiments 1 to 3. The electronic apparatus 1001 may be a mobile communications apparatus and includes an antenna 49, the SAW filter device 10 connected with the antenna 49, and an electronic circuit 1002 connected to the SAW filter device 10.

The SAW filter devices according to Embodiments 1 to 3 have advantages for suppressing spurious and reducing an insertion loss, and can be applicable to electronic, such as mobile communications apparatuses.

What is claimed is:

1. A surface acoustic wave (SAW) filter device comprising:
an input port for receiving an unbalanced signal;
a pair of input/output ports;
a first SAW filter for receiving the unbalanced signal from the input port and outputting balanced signals to the pair of input/output ports;
a second SAW filter for receiving the balanced signals output from the pair of input/output ports and outputting balanced signals; and
a pair of output ports for outputting the balanced signals output from the second SAW filter,
wherein the first SAW filter includes
a first longitudinally-coupled SAW resonator having a first unbalanced signal input port, a first balanced signal output port, a second balanced signal output port, a first input IDT electrode, a first output IDT electrode, and a second output IDT electrode, and
a second longitudinally-coupled SAW resonator having a second unbalanced signal input port, a third balanced signal output port, a fourth balanced signal output port, a second input IDT electrode, a third output IDT electrode, and a fourth output IDT electrode,
wherein the first output IDT electrode has a ground electrode electrically connected to ground and a wiring electrode electrically connected to the first balanced signal output port,
wherein the second output IDT electrode has a ground electrode electrically connected to ground and a wiring electrode electrically connected to the second balanced signal output port,
wherein the first output IDT electrode and the second output IDT electrode are (i) arranged on opposite sides of the first input IDT electrode and (ii) arranged so that the wiring electrode of the first output IDT electrode and the wiring electrode of the second output IDT electrode face the same direction,
wherein the first input IDT electrode is electrically connected to the first unbalanced signal input port,
wherein the third output IDT electrode has a ground electrode electrically connected to ground and a wiring electrode electrically connected to the third balanced signal output port,
wherein the fourth output IDT electrode has a ground electrode electrically connected to ground and a wiring electrode electrically connected to the fourth balanced signal output port,
wherein the third output IDT electrode and the fourth output IDT electrode are (i) arranged on opposite sides of the second input IDT electrode and (ii) arranged so that the wiring electrode of the third output IDT electrode and the wiring electrode of the fourth output IDT electrode face the same direction, wherein the second input IDT electrode is electrically connected to the second unbalanced signal input port, wherein the first unbalanced signal input port and the second unbalanced signal input port are electrically connected to the input port, wherein the first balanced signal output port and the third balanced signal output port both are electrically connected to one of the pair of input/output ports, and wherein the second balanced signal output port and the fourth balanced signal output port both are electrically connected to another of the pair of input/output ports.

2. The SAW filter device according to claim 1, wherein the second SAW filter includes a third longitudinally-coupled SAW resonator electrically connected to the pair of input/output ports and the pair of output ports.

3. The SAW filter device according to claim 2, further comprising a capacitance element connected between the pair of input/output ports.

4. The SAW filter device according to claim 2, further comprising an inductance element connected between the pair of input/output ports.

5. The SAW filter device according to claim 1,
wherein a polarity of an electrode finger located at an outermost end of the first output IDT electrode, the second output IDT electrode, and the first input IDT electrode of the first longitudinally-coupled SAW resonator is identical to a polarity of an electrode finger located at an outermost end of the third output IDT electrode, the fourth output IDT electrode, and the second input IDT electrode of the second longitudinally-coupled SAW resonator.

6. The SAW filter device according to claim 5, wherein the first output IDT electrode, the second output IDT electrode, and the first input IDT electrode of the first longitudinally-coupled SAW resonator have an overlapping width larger than an overlapping width of the third output IDT electrode, the fourth output IDT electrode, and the second input IDT electrode of the second longitudinally-coupled SAW resonator.

7. The SAW filter device according to claim 1, further comprising:

a first wiring connected between the third balanced signal output port and a first node at which the first balanced signal output port is connected with one of the pair of input/output ports;

a second wiring connected between the second balanced signal output port and a second node at which the fourth balanced signal output port is connected with the other of the pair of input/output ports, the second wiring crossing the first wiring; and a dielectric film provided between the first wiring and the second wiring, wherein the first wiring and the second wiring cross and face each other across the dielectric film.

8. The SAW filter device according to claim 7, wherein the dielectric film is made of silicon oxide.

9. The SAW filter device according to claim 7, wherein the dielectric film covers an upper surface of at least one of the first longitudinally-coupled SAW resonator and the second longitudinally-coupled SAW resonator to act as a functional layer for the at least one of the first longitudinally-coupled SAW resonator and the second longitudinally-coupled SAW resonator.

10. The SAW filter device according to claim 7, wherein the dielectric film is made of resin material.

11. A duplexer comprising:
a receiver filter including the SAW filter device according to claim 1;
an antenna terminal connected to the receiver filter; and
a transmitter filter connected to the antenna terminal.

12. An electronic apparatus comprising:
the SAW filter device according to claim 1; and
an electronic circuit connected to the SAW filter device.

13. The SAW filter device according to claim 1,
wherein the first balanced signal output port and the second balanced signal output port output signals that are out of phase with each other, and
wherein the third balanced signal output port and the fourth balanced signal output port output signals that are out of phase with each other.

14. The SAW filter device according to claim 1,
wherein the first balanced signal output port and the third balanced signal output port outputs signals that are identical in phase with each other, and
wherein the second balanced signal output port and the fourth balanced signal output port output signals that are identical in phase with each other.

* * * * *